United States Patent
Van Schoot et al.

(10) Patent No.: US 9,989,863 B2
(45) Date of Patent: Jun. 5, 2018

(54) LITHOGRAPHIC SYSTEM

(71) Applicant: ASML Netherlands B.V., Veldhoven (NL)

(72) Inventors: Jan Bernard Plechelmus Van Schoot, Eindhoven (NL); Andrei Mikhailovich Yakunin, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

(21) Appl. No.: 15/119,100

(22) PCT Filed: Jan. 23, 2015

(86) PCT No.: PCT/EP2015/051352
§ 371 (c)(1),
(2) Date: Aug. 15, 2016

(87) PCT Pub. No.: WO2015/124372
PCT Pub. Date: Aug. 27, 2015

(65) Prior Publication Data
US 2017/0052456 A1    Feb. 23, 2017

(30) Foreign Application Priority Data

Feb. 24, 2014  (EP) .................................. 14156364
Jun. 19, 2014  (EP) .................................. 14173121

(51) Int. Cl.
*G03F 7/20*  (2006.01)
*H05G 2/00*  (2006.01)

(52) U.S. Cl.
CPC ........ *G03F 7/70433* (2013.01); *G03F 7/7025* (2013.01); *G03F 7/70033* (2013.01);
(Continued)

(58) Field of Classification Search
USPC .......................................... 250/504 R, 492.2
See application file for complete search history.

(56) References Cited

U.S. PATENT DOCUMENTS

2002/0044629 A1* 4/2002 Hertz .................. G03F 7/70033
378/119
2006/0208206 A1* 9/2006 Hainz ................. G03F 7/70083
250/493.1

(Continued)

FOREIGN PATENT DOCUMENTS

| TW | 201316842 | 4/2013 |
|---|---|---|
| WO | 2013/029906 | 3/2013 |
| WO | 2013/041323 | 3/2013 |

OTHER PUBLICATIONS

International Search Report and Written Opinion dated Aug. 10, 2015 in corresponding International Patent Application No. PCT/EP2015/051352.

(Continued)

*Primary Examiner* — Kiet T Nguyen
(74) *Attorney, Agent, or Firm* — Pillsbury Winthrop Shaw Pittman LLP

(57) ABSTRACT

A lithographic system including a lithographic apparatus with an anamorphic projection system, and a radiation source configured to generate an EUV radiation emitting plasma at a plasma formation location, the EUV radiation emitting plasma having an elongate form in a plane substantially perpendicular to an optical axis of the radiation source.

27 Claims, 7 Drawing Sheets

(52) U.S. Cl.
CPC ...... *G03F 7/70066* (2013.01); *G03F 7/70091* (2013.01); *G03F 7/70241* (2013.01); *G03F 7/70425* (2013.01); *G03F 7/70483* (2013.01); *H05G 2/005* (2013.01); *H05G 2/008* (2013.01)

(56) References Cited

U.S. PATENT DOCUMENTS

| | | |
|---|---|---|
| 2010/0078579 A1 | 4/2010 | Endo et al. |
| 2013/0128251 A1 | 5/2013 | Mann |

OTHER PUBLICATIONS

Chinese Office Action dated Aug. 18, 2017 in corresponding Chinese Patent Application No. 201580010247.4.

* cited by examiner

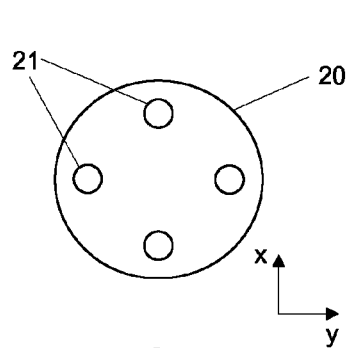
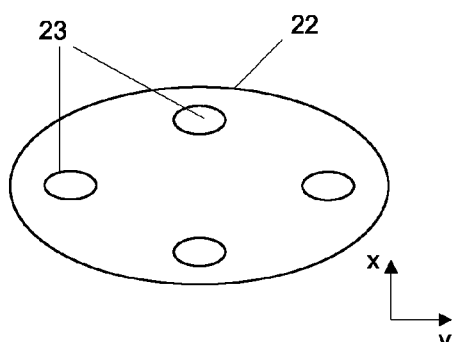
FIG. 3a  FIG. 3b
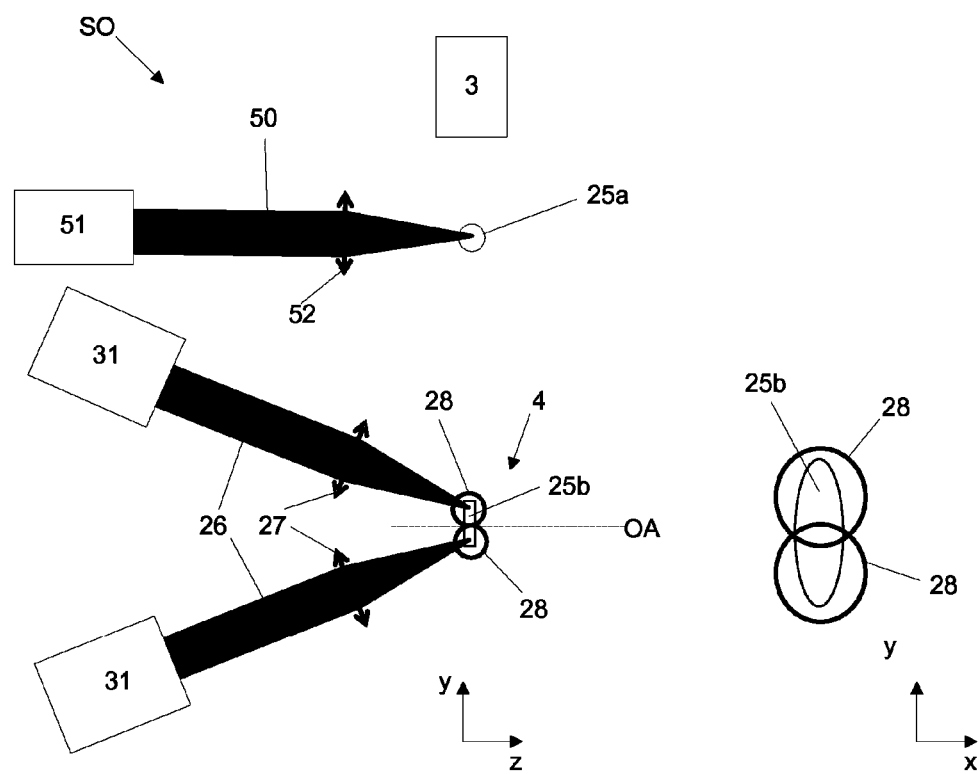
FIG. 4a  FIG. 4b

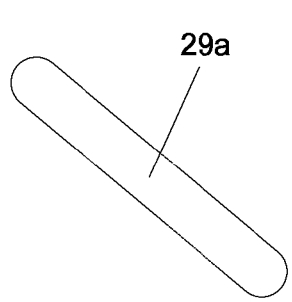
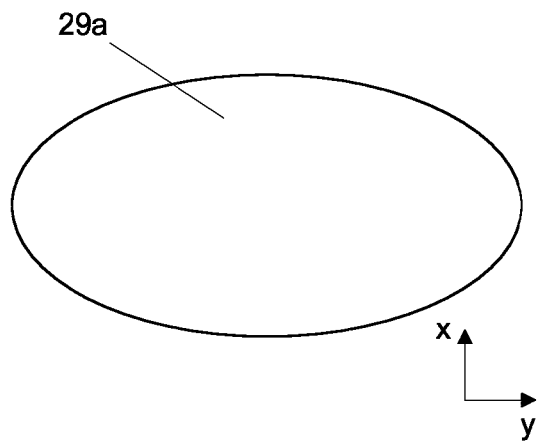
FIG. 5a  FIG. 5b
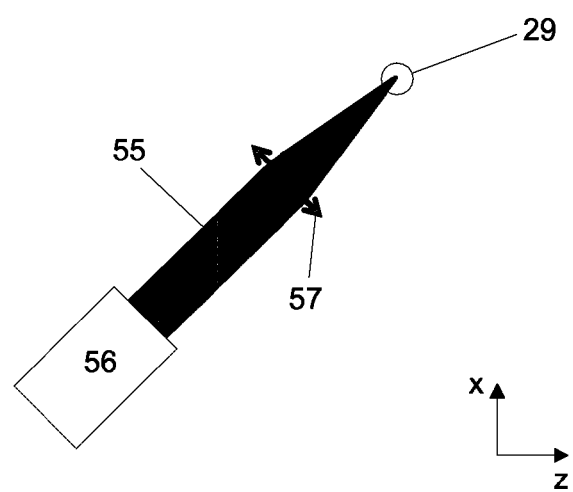
FIG. 6

LITHOGRAPHIC SYSTEM

CROSS-REFERENCE TO RELATED APPLICATIONS

This application is the U.S. national phase entry of PCT patent application no. PCT/EP2015/051352, which was filed on Jan. 23, 2015, which claims the benefit of priority of EP Patent Application No. 14156364.3, filed Feb. 24, 2014, and of EP Patent Application No. 14173121.6, filed Jun. 19, 2014, each of which is are incorporated by reference herein in its entirety.

FIELD

The present invention relates to a lithographic system.

BACKGROUND

A lithographic apparatus is a machine constructed to apply a desired pattern onto a substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size (critical dimension) of features can be obtained in three ways: by shortening the exposure wavelength $\lambda$, by increasing the numerical aperture NA or by decreasing the value of k1.

In order to shorten the exposure wavelength $\lambda$ and, thus, reduce the critical dimension (CD), an extreme ultraviolet (EUV) radiation may be used. EUV radiation may be considered to be radiation having a wavelength within the range 4-20 nm. A lithographic apparatus which uses EUV radiation, may be used to form smaller features on a substrate than a lithographic apparatus which uses radiation of a longer wavelength (e.g. a wavelength of approximately 193 nm). EUV radiation may be generated using a laser produced plasma radiation source or some other EUV radiation source. A radiation source and a lithographic apparatus may together be referred to as a lithographic system.

It is desirable to provide a radiation source and a lithographic system which obviates or mitigates one or more problems arising from the prior art.

SUMMARY

According to a first aspect of the invention there is provided a lithographic system comprising a lithographic apparatus with an anamorphic projection system, and a radiation source configured to generate an EUV radiation emitting plasma at a plasma formation location, the EUV radiation emitting plasma having an elongate form in a plane substantially perpendicular to an optical axis of the radiation source.

The EUV radiation emitting plasma may be generally elliptical in a plane perpendicular to the optical axis of the radiation source.

The EUV radiation emitting plasma may be elongate in a direction which corresponds with a major axis of a pupil of the anamorphic projection system.

The radiation source may include a pre-pulse laser which is configured to provide a laser pulse which causes a fuel droplet to expand by more in a first direction than in a second direction, the first and second directions being perpendicular to the direction of incidence of the laser pulse.

The laser pulse provided by the pre-pulse laser may have a generally elliptical cross-section.

The laser pulse provided by the pre-pulse laser may be linearly polarized in the first direction.

The radiation source may include a pre-pulse laser which is configured to cause a fuel droplet to expand to form a target which is tilted relative to an optical axis of the radiation source.

The tilt of the target relative to the optical axis of the radiation source may be between 30 degrees and 60 degrees.

The target may be generally disk-shaped.

The radiation source may comprise two or more lasers configured to provide laser beam waists which partially overlap at the plasma formation location.

The two or more lasers may be configured to provide laser beam pulses sequentially, such that a first portion of the EUV radiation emitting plasma is generated before a second portion of the EUV radiation emitting plasma is generated.

The first and second portions of the EUV radiation emitting plasma may be generated from the same fuel target. Alternatively, the first and second portions of the EUV radiation emitting plasma may be generated from different fuel targets.

According to a second aspect of the invention there is provided a lithographic system comprising a lithographic apparatus with an anamorphic projection system, a first radiation source configured to generate an EUV radiation emitting plasma at a first plasma formation location and direct EUV radiation to a first intermediate focus, and a second radiation source configured to generate an EUV radiation emitting plasma at a second plasma formation location and direct EUV radiation to a second intermediate focus, the second intermediate focus being spatially displaced from the first intermediate focus, and an illumination system configured to receive EUV radiation from the first and second intermediate focuses.

According to a third aspect of the invention there is provided a radiation source comprising a radiation source configured to generate an EUV radiation emitting plasma at a plasma formation location, the EUV radiation emitting plasma having an elongate form in a plane substantially perpendicular to an optical axis of the radiation source.

The EUV radiation emitting plasma may be generally elliptical in a plane perpendicular to the optical axis of the radiation source.

The radiation source may include a pre-pulse laser which is configured to provide a laser pulse which causes a fuel droplet to expand by more in a first direction than in a second direction, the first and second directions being perpendicular to the direction of incidence of the laser pulse.

The radiation source may include a pre-pulse laser which is configured to cause a fuel droplet to expand to form a target which is tilted relative to an optical axis of the radiation source.

According to a fourth aspect of the invention there is provided a lithographic method comprising using a radiation source to generate an EUV radiation emitting plasma at a plasma formation location, the EUV radiation emitting plasma having an elongate form in a plane substantially perpendicular to an optical axis of the radiation source, using an illumination system to condition the resulting EUV radiation, patterning the EUV radiation in its cross-section to form a patterned radiation beam, and projecting the patterned EUV radiation beam onto a substrate using an anamorphic projection system.

The EUV radiation emitting plasma may be generally elliptical in a plane perpendicular to the optical axis of the radiation source.

The EUV radiation emitting plasma may be elongate in a direction which corresponds with a major axis of a pupil of the anamorphic projection system.

According to a fifth aspect of the invention there is provided a lithographic apparatus comprising an illumination system for providing a beam of radiation, a support structure for supporting a mask, the mask serving to impart the radiation beam with a pattern in its cross-section, a substrate table for holding a substrate, and a projection system for projecting the patterned radiation beam onto a target portion of the substrate, wherein the lithographic apparatus is configured to move the mask and the substrate with a scanning movement during exposure of the substrate, and wherein the projection system has a reduction factor in the direction of scanning movement of around 2.5× and has a reduction factor in a perpendicular direction of around 3.2×.

According to a sixth aspect of the invention there is provided a lithographic apparatus comprising an illumination system for providing a beam of radiation, a support structure for supporting a mask, the mask serving to impart the radiation beam with a pattern in its cross-section, a substrate table for holding a substrate, and a projection system for projecting the patterned radiation beam onto a target portion of the substrate, wherein the lithographic apparatus is configured to move the mask and the substrate with a scanning movement during exposure of the substrate, and wherein the projection system has a reduction factor in the direction of scanning movement of around 1.8× and has a reduction factor in a perpendicular direction of around 3.2×.

According to a seventh aspect of the invention there is provided a lithographic apparatus comprising an illumination system for providing a beam of radiation, a support structure for supporting a mask, the mask serving to impart the radiation beam with a pattern in its cross-section, a substrate table for holding a substrate, and a projection system for projecting the patterned radiation beam onto a target portion of the substrate, wherein the lithographic apparatus is configured to move the mask and the substrate with a scanning movement during exposure of the substrate, and wherein the projection system has a reduction factor in the direction of scanning movement of around 1.8× and has a reduction factor in a perpendicular direction of around 1.6×.

According to an eighth aspect of the invention there is provided a lithographic apparatus comprising an illumination system for providing a beam of radiation, a support structure for supporting a mask, the mask serving to impart the radiation beam with a pattern in its cross-section, a substrate table for holding a substrate, and a projection system for projecting the patterned radiation beam onto a target portion of the substrate, wherein the lithographic apparatus is configured to move the mask and the substrate with a scanning movement during exposure of the substrate, and wherein the projection system has a reduction factor in the direction of scanning movement of around 7.5× and has a reduction factor in a perpendicular direction of around 4.8×.

According to a ninth aspect of the invention there is provided a method of exposing an exposure field using a scanning lithographic apparatus, the method comprising using a beam of radiation to illuminate a mask having a patterned area with dimensions which correspond with those of a conventional mask, using an anamorphic projection system to project the patterned area onto a wafer to form an exposure field having a dimension perpendicular to the scanning direction that corresponds with a conventionally exposed dimension in the scanning direction, and a dimension in the scanning direction which is a multiple of the conventionally exposed dimension in the non-scanning direction.

According to a tenth aspect of the invention there is provided a method of exposing an exposure field using a scanning lithographic apparatus, the method comprising using a beam of radiation to illuminate a mask having a patterned area with dimensions which correspond with those of a conventional mask, using an anamorphic projection system to project the patterned area onto a wafer to form an exposure field having a dimension perpendicular to the scanning direction which is a multiple of a conventionally exposed dimension in the scanning direction, and a dimension in the scanning direction which is a multiple of the conventionally exposed dimension in the non-scanning direction.

The conventionally exposed dimension in the scanning direction may be 33 mm and the conventionally exposed dimension in the non-scanning direction may be 26 mm.

According to an eleventh aspect of the invention there is provided a method of measuring rotation of a projection system of a lithographic apparatus relative to a scanning direction of the lithographic apparatus, the method comprising illuminating patterns using a central portion of a band of radiation and measuring positions of aerial images of the patterns formed by the projection system, illuminating the patterns using a portion of the band of radiation which is located away from the central portion and measuring positions of aerial images of the patterns formed by the projection system, illuminating the patterns using a portion of the band of radiation which is located away from the central portion in an opposite direction and measuring positions of aerial images of the patterns formed by the projection system; and calculating the rotation of the projection system by comparing the measured positions of the pattern aerial images.

Calculating the rotation of the projection system may comprise comparing the measured positions of the pattern aerial images in a direction substantially perpendicular to the scanning direction of the lithographic apparatus.

The method may further comprise using differences between the measured positions to determine non-telecentricity of the projection system.

The patterns may be provided on a mask support structure of the lithographic apparatus.

The patterns may be provided at opposite ends of the mask support structure of the lithographic apparatus, and wherein the method is performed using patterns provided at one end of the mask support structure and is then performed using patterns provided at the opposite end of the mask support structure.

Different aspects of the invention may be combined with one another.

BRIEF DESCRIPTION OF THE DRAWINGS

Embodiments of the invention will now be described, by way of example only, with reference to the accompanying drawings, in which:

FIG. 3a and FIG. 3b schematically illustrate a pupil of a conventional projection system and a pupil of an anamorphic projection system;

FIG. 4a and FIG. 4b schematically illustrate a radiation source according to an embodiment of the invention;

FIG. 5a and FIG. 5b schematically illustrate a fuel target generated by an embodiment of the invention;

FIG. 6 schematically illustrates generation of the fuel target shown in FIG. 5;

DETAILED DESCRIPTION

Figure 1:
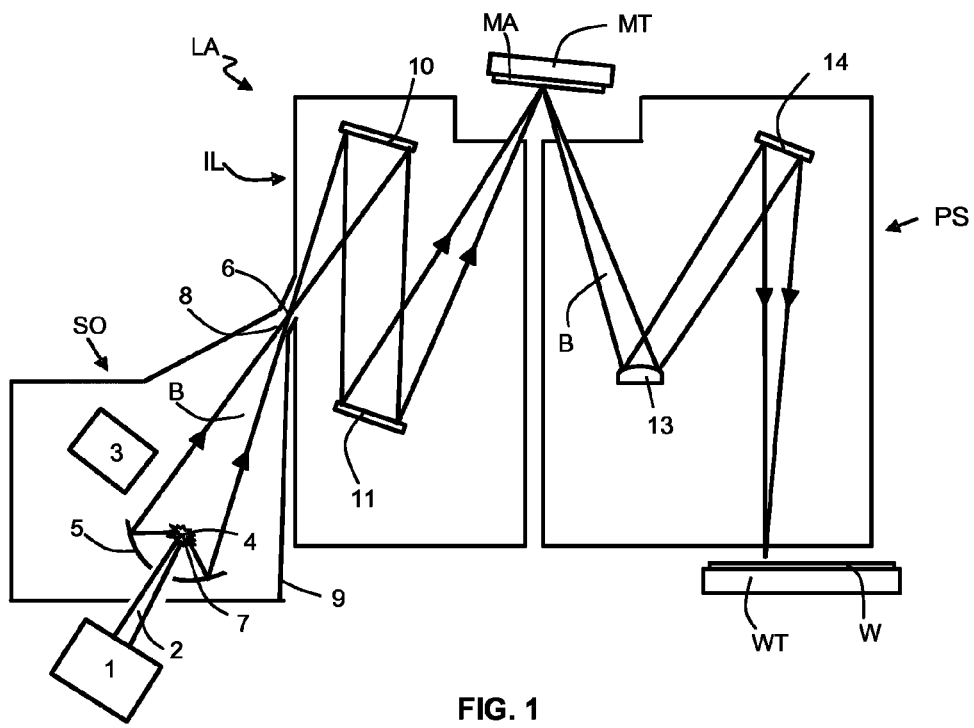
FIG. 1 is a schematic depiction of a lithographic system comprising a lithographic apparatus and a radiation source.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system PS is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

The radiation source SO may alternatively comprise a free electron laser. A free electron laser may produce EUV radiation by accelerating electrons to relativistic speeds. The relativistic electrons are then passed through an undulating magnetic field which causes the relativistic electrons to follow an oscillating path thereby causing stimulated emission of coherent EUV radiation. A free electron laser may produce enough EUV radiation to simultaneously provide EUV radiation to several lithographic apparatus LA.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system PS comprises a plurality of mirrors which are configured to project the radiation beam B onto a substrate W held by the substrate table WT. The projection system PS applies a reduction factor to the radiation beam, forming an image with features that are smaller than corresponding features on the patterning device MA. Although the projection system PS has two mirrors in FIG. 1, the projection system may include any number of mirrors (e.g. six, seven, eight, nine or ten mirrors).

The projection system PS, focuses the radiation beam B onto a target portion of the substrate W. The target portion may be referred to as an exposure field. The substrate table WT can be moved accurately, e.g. so as to position different target portions in the path of the radiation beam B. The substrate table WT may, for example, be positioned by one or more positioners (not shown). In order to increase the accuracy with which the substrate table is positioned, one or more position sensors (not shown) may be used to measure the position of the substrate table WT relative to the radiation beam B. Measurements made by the one or more position sensors may be fed back to the one or more positioners.

The depicted apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam which is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

A projection system PS of a conventional lithographic apparatus LA may apply a demagnification of approximately 4× in both the x-direction and the y-direction. It may however, be advantageous to increase the demagnification of a projection system PS in at least one of the x and/or y-directions. As will be explained below, it may in particular be advantageous to increase the demagnification of a projection system PS in the y-direction.

Figure 2:
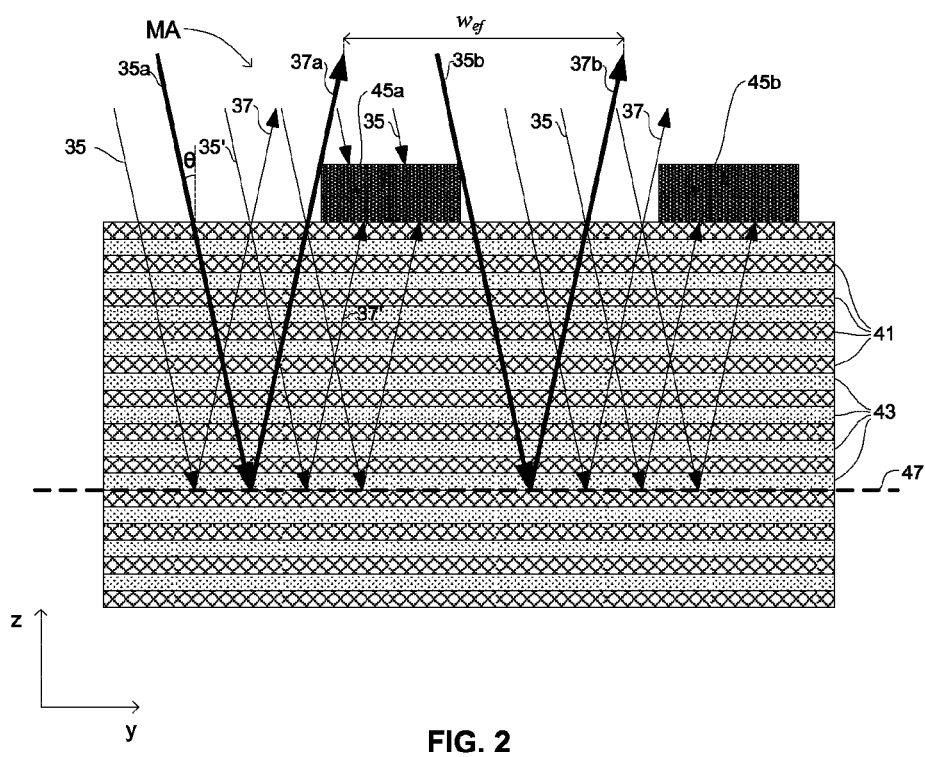
FIG. 2 is a cross-sectional view of a mask.

The advantages of increasing the demagnification of a projection system PS (to larger demagnifications than the 4× demagnification of a conventional projection system PS) will now be described with reference to FIG. 2. FIG. 2 is a cross-sectional view of a portion of a mask MA. The mask MA comprises a plurality of pairs of alternating layers of a first material 41 and a second material 43. The first material 41 and the second material 43 have different refractive indices. The thicknesses and refractive indices of the layers of material 41, 43 are such that the materials act as a multilayer mirror structure.

A series of rays 35 of EUV radiation are depicted by arrows in FIG. 2 as being incident on the mask MA. The change of refractive index which occurs at interfaces between layers of the first material 41 and layers of the second material 43 causes some EUV radiation to be reflected from each interface. For example, a portion of EUV radiation may be reflected from the uppermost interface between the first and second materials 41, 43 with the remainder of the radiation being transmitted to lower layers. Portions of the transmitted radiation may then be reflected from interfaces between the first and second materials which are situated within the multilayer structure of the mask MA. Reflections from different interfaces in the mask MA constructively interfere with each other to form reflected rays 37. The combined effect of reflection from many different layers of the mask MA may be considered to be equivalent to the reflected EUV radiation being reflected from an effective plane of reflection 47 which lies within the multilayer mirror structure. The effective plane of reflection 47 may, for example, be positioned approximately 16 layers below the upper surface of the mask MA as shown in FIG. 2. All of the incident rays 35 of radiation are depicted in FIG. 2 as being reflected from the effective plane of reflection 47. However it should be appreciated that some radiation may be reflected from positions above the effective plane of reflection 47 and some radiation may be reflected from positions below the effective plane of reflection 47.

As will be appreciated from FIG. 1 and FIG. 2, the beam of EUV radiation which is incident on the mask MA is not perpendicularly incident on the mask MA. The angle subtended by the beam of radiation relative to a perpendicular which extends from the mask MA (i.e. the angle between the radiation beam and the z-axis) may be referred to as the chief ray angle $\theta$ (shown in FIG. 2). In practice the mask MA may be illuminated from a range of angles and the chief ray angle $\theta$ may be considered to be the mean of these angles. For ease of illustration only the rays which are incident on the mask MA at the chief ray angle $\theta$ are illustrated in FIG. 2.

A pattern is formed on the mask MA by providing regions of EUV-absorbing material 45 on the upper surface of the multilayer mirror structure. Two-blocks of EUV-absorbing material 45a, 45b are depicted in FIG. 2. The blocks 45a, 45b each have a width w and a height h. If EUV radiation were to be perpendicularly incident (i.e. with a chief ray angle $\theta$ of zero) upon the mask MA then the height h of the blocks of EUV-absorbing material 45a, 45b would have no effect on the radiation which is reflected from the mask MA. However, because the EUV radiation is incident on the mask MA with a non-zero chief ray angle $\theta$, some of the radiation which is reflected by the multilayer structure of the mask MA is subsequently absorbed by a block of EUV-absorbing material 45a, 45b. For example, the ray 35' which is depicted in FIG. 2 is incident on a portion of the upper surface of the mask MA which is not provided with EUV-absorbing material and is therefore reflected from the effective plane of reflection 47. However, the corresponding reflected ray 37' is absorbed by the block of EUV-absorbing material 45a and does not therefore leave the mask MA.

The incident ray 35a (which is depicted with a thick line in FIG. 2) represents the closest ray to the left-hand side of the block 45a which still results in a reflected ray 37a that leaves the mask MA (and which is not therefore absorbed by the block 45a). The incident ray 37b (which is also depicted with a thick line in FIG. 2) represents the closest ray to the right-hand side of the block 45a which is not absorbed by the block 45a and therefore results in a reflected ray 37b. The separation between the reflected rays 37a and 37b represents the effective width $w_{ef}$ of the absorbing block 45a which is patterned in to the radiation which is reflected from the mask MA. As can be seen in FIG. 2, the absorbing block 45a has an effective width $w_{ef}$ which is considerably greater than the width w of the block 45a.

As will be appreciated from FIG. 2 and the description provided above, any increase in the chief ray angle θ will result in an increase in the effective width $w_{ef}$ of features which are patterned onto the mask MA. An increase in the effective width $w_{ef}$ of patterned features may be undesirable since this may result in an increase in the achievable critical dimension (CD) of features which can be patterned onto the substrate W.

The chief ray angle θ may be selected taking into account the numerical aperture of the projection system PS at the entrance of the projection system. In particular the chief ray angle θ may be selected such that the capture angle of radiation captured by the projection system PS does not overlap with a perpendicular which extends from the mask MA. As was described above in relation to equation 1, in order to decrease the achievable CD of a lithographic apparatus it may be desirable to increase the numerical aperture (NA) of the projection system PS. However because the capture angle of the projection system PS increases as the numerical aperture of the projection system PS increases, an increase of the numerical aperture on the entrance side of the projection system PS must be accompanied by an increase of the chief ray angle θ (which may be undesirable as was described above with reference to FIG. 2).

Increasing the demagnification of a projection system PS is advantageous since it allows the numerical aperture on the substrate side of the projection system PS to be increased without increasing the numerical aperture on the mask side of the projection system PS. In this context the term "substrate side of the projection system" is intended to mean the portion of the projection system PS which is closest to the substrate table WT. The term "mask side of the projection system" is intended to mean the portion of the projection system PS which is closest to the support structure MT.

Increasing the demagnification of the projection system PS therefore allows the numerical aperture on the substrate side of the projection system PS to be increased (thereby advantageously decreasing the critical dimension) without the need to increase the numerical aperture on the mask side of the projection system PS (thereby avoiding the need to increase the chief ray angle θ). The disadvantageous effects of increasing the chief ray angle θ which were described above with reference to FIG. 2 may therefore be avoided whilst achieving a reduction in the critical dimension.

It will be appreciated from the description above in relation to FIG. 2 that the effect of the chief ray angle θ on the achievable critical dimension only applies to the dimension of features which extend in the y-direction (e.g. the effective width $w_{ef}$ of absorbing blocks 45a, 45b). The achievable critical dimension in the x-direction is not affected by the chief ray angle θ. Illumination in the x-direction has a chief ray angle which is perpendicular to the mask MA, and thus the problem illustrated in FIG. 2 does not arise.

It is therefore an increase in the demagnification of the projection system PS in the y-direction which is particularly advantageous in decreasing the achievable critical dimension. The demagnification of a projection system PS may therefore be advantageously increased in the y-direction without a corresponding increase in the demagnification in the x-direction. A projection system PS which applies a different demagnification factor in the x and y-directions may be referred to as an anamorphic projection system PS.

In an embodiment, the projection system PS of the lithographic apparatus may apply a demagnification of approximately 4× in the x-direction and a demagnification of approximately 8× in the y-direction. Other combinations of demagnifications may be used, with one demagnification being significantly larger than the other. For the reasons explained above the demagnification in the scanning direction may be significantly larger than the demagnification perpendicular to the scanning direction.

FIG. 3a shows schematically the pupil 20 of the projection system PS of an EUV lithographic apparatus having symmetric demagnification in the x and y-directions. The pupil 20 is circular. A simple illumination mode which is matched to the pupil 21 of the projection system PS will thus also be circular. Also shown in FIG. 3a is a quadrupole mode which comprises four poles 21. Each pole 21 is circular in shape and the poles are distributed in a circular manner.

FIG. 3b shows schematically the pupil of an anamorphic projection system PS in which the demagnification in the y-direction is greater than the demagnification in the x-direction. In this example, the demagnification in the x-direction is 4× and the demagnification in the y-direction is 8×. Due to the anamorphic nature of the projection system PS the pupil 22 is elliptical in shape, and has a major axis in the y-direction which is twice as long as the minor axis in the x-direction. Due to the elliptical nature of the pupil if a simple circular illumination mode is used this will not efficiently fill the pupil (a considerable amount of radiation will fall outside of the pupil on either side of the pupil in the x-direction). Also shown in FIG. 3b is a quadrupole illumination mode. The quadrupole mode comprises four poles 23 which each have an elliptical shape having a major axis in the y-direction and a minor axis in the x-direction. The poles are distributed in an elliptical manner.

In order to provide efficient filling of the pupil of the anamorphic projection system PS, it is desirable to provide radiation from the illumination system IL which, in a simple illumination mode, has an elliptical shape that is substantially matched to the pupil. Advantageously, this can be achieved by generating an EUV emitting plasma which has an elongate form (e.g. generally elliptical in shape). This may be done, for example, using an LPP radiation source.

FIG. 4 shows schematically an LPP radiation source SO which may be used to provide an EUV emitting plasma having an elliptical shape. FIG. 4a shows the radiation source viewed from above (in substantially the same plane as the radiation source SO shown in FIG. 1). FIG. 4b shows a fuel target 25b used to generate the EUV emitting plasma, and laser beams 28 as viewed from one side. A fuel emitter 3 is used to emit droplets of fuel 25a,25b towards a plasma formation region 4. The fuel emitter 3 may be as described further above in connection with FIG. 1. The fuel may be tin, although other suitable materials may be used.

A fuel droplet 25a travelling towards the plasma formation region 4 will have a substantially spherical shape, but this shape is modified by a pulse of laser radiation 50 which is incident upon the droplet before it reaches the plasma formation location. This laser pulse 50, which may be referred to as a pre-pulse, is generated by a pre-pulse laser 51 and is focused by a lens 52 (or other focusing element such as a mirror). The laser pre-pulse 50 changes the shape of the droplet 25a to form an elliptically shaped fuel target 25b as represented schematically in FIG. 4b (the mechanism which changes the shape of the fuel droplet is described further below).

Two laser beams 26 are incident upon the elliptical fuel target 25. The laser beams are focused by lenses 27 (or other focusing optical elements such as mirrors) to form beam waists which are schematically depicted by circles 28. The beam waists of the focused laser beams 28 overlap with each other, but have centre points which are separated from each other in the y-direction as schematically shown in FIG. 4b. The laser beam waists 28 are thus arranged such that they illuminate the elliptical fuel target 25b along its entire length, the illumination having sufficient intensity to generate an EUV emitting plasma along substantially the entire length of the fuel target.

The elliptical fuel target 25b is thus converted by the focused laser beams 28 into an EUV emitting plasma which has a generally elliptical shape (the ellipse being substantially perpendicular to the optical axis OA). The EUV radiation which is emitted by the plasma thus has a generally elliptical source. Since the EUV radiation is emitted by a generally elliptical source it is well matched to the elliptical pupil of the anamorphic projection system PS (shown in FIG. 3b) and thus facilitates the efficient filling of the pupil (the major axis of the EUV radiation emitting plasma may correspond with the major axis of the projection system pupil). The term "generally elliptical" in this context may be interpreted as meaning an elongate, non-circular, shape which may approximate to an elliptical shape (e.g. averaged over time). It is not intended to mean a shape which is a perfect ellipse or which is necessarily close to a perfect ellipse.

Although an EUV emitting plasma with a generally elliptical shape provides a good match to the elliptical pupil of the anamorphic projection system PS, other shapes of EUV emitting plasma may be used. An EUV emitting plasma which has an elongate form substantially perpendicular to the optical axis OA of the radiation source may provide more efficient filling of the elliptical projection system pupil than a generally circular EUV emitting plasma. Thus, embodiments of the invention may be configured to provide an EUV emitting plasma which has an elongate form. The generally elliptical EUV emitting plasma may be considered to be an example of an EUV emitting plasma which has an elongate form.

Using two laser beams 26 to generate the EUV emitting plasma is advantageous because it allows a higher conversion efficiency of the fuel to EUV radiation to be achieved. When converting a fuel target to EUV radiation there is an optimum laser irradiance which provides for the most efficient conversion. If the laser irradiance is below the optimum, then some of the fuel target will not be converted to radiation emitting plasma. If the irradiance is above the optimum, then the temperature of the plasma will be too high and this will cause the plasma to emit radiation at wavelengths which are shorter than the desired wavelength (e.g. shorter than 13.5 nm).

Making the fuel target larger provides a larger surface area for receiving incident laser radiation, and this allows a larger area of fuel to be fuel to be illuminated with the optimum irradiance. If the area of the fuel which is illuminated with the optimum irradiance is doubled, then this can, very roughly, be expected to provide a doubling of the amount of EUV radiation emitted by the plasma. However, it may not be possible to increase the size of the beam waist generated by a laser whilst at the same time maintaining the optimum irradiance within that beam waist. The achievable energy density of radiation provided by the laser may have an upper limit which stems from laws of physics and which cannot be increased without at the same time shifting the wavelength of the laser radiation (which would be undesirable). This problem is overcome by embodiments of the invention, since instead of using a single laser beam to generate the EUV emitting plasma two laser beams are used. Each laser beam may be configured to provide an optimum irradiance at the portion of the fuel target 25 upon which it is incident. Thus, using two lasers, for example in the manner shown in FIG. 4, provides an increase in the amount of EUV radiation emitted by the plasma. In addition to this beneficial increase in the amount of EUV radiation generated, a further advantage arises because the EUV radiation has a generally elliptical shape which is substantially matched to the elliptical pupil of the anamorphic projection system PS.

There are various ways in which the fuel target 25 may be arranged to have an elliptical shape. These are described below.

The pre-pulse 50 which is incident upon the fuel droplet 25a before it reaches the plasma formation region 4 may have an elliptical shape. The elliptical shape of the pre-pulse will provide an unequal distribution of laser radiation across the surface of the fuel droplet. This unequal distribution will provide an unequal temperature and pressure distribution across the fuel droplet which will in turn cause the fuel droplet to expand in a non-circularly-symmetric manner. As a result of this expansion the fuel droplet will expand to form a generally elliptically shaped fuel target 25b, for example as represented schematically in FIG. 4. As illustrated schematically, the fuel target 25b is elliptically shaped when viewed from the z-direction (i.e. along the optical axis of the radiation source), but transverse to this direction the fuel target may be generally flat. Thus, the fuel target may have the general form of a pancake which is elliptical when viewed from along the optical axis OA.

In an alternative approach, the pre-pulse 50 may be generally circular in cross-section, but may have a linear polarization. The linearly polarized laser radiation will couple to the plasma more effectively in the direction of polarization than in a direction transverse to the polarization. Thus, referring to FIG. 4, linear polarization of the pre-pulse 50 in the y-direction will cause the pre-pulse to be absorbed more efficiently in that direction by the fuel droplet 25a. This will cause the fuel droplet 25a to be heated more in that direction and thus expand more in the y-direction. Again, this will generate a fuel target 25b having an elliptical shape as shown schematically in FIG. 4 (the fuel target being flat when viewed transverse to the optical axis OA).

The above two approaches may be used in combination, i.e. an elliptical pre-pulse may have a linear polarization (e.g. with the direction of linear polarization corresponding with the major axis of the ellipse).

In an alternative arrangement the pre-pulse may be arranged to shape the fuel target such that it has the form of a circular pancake (i.e. generally disk-shaped), but with the fuel target tilted about the y-axis such that it presents an elliptical shape to the incident laser beams. This is shown schematically in FIG. 5. FIG. 5a shows the fuel target 29a as viewed along the y-direction, and as can be seen the fuel target has been tilted by approximately 45° about the y-axis. As a result of this tilt, although the fuel target is generally disk-shaped and has a generally circular perimeter, the fuel target as viewed along the z-axis has an elliptical shape (as shown in FIG. 5b). The z-axis of FIG. 5 corresponds with the optical axis OA of the radiation source (see FIG. 4). The laser beams of the radiation source are therefore presented with a fuel target 29a with an elliptical shape, and thus convert the fuel target to a generally elliptical EUV emitting plasma in the manner described further above in connection with FIG. 4.

Referring to FIG. 6, tilting of the fuel droplet is achieved by directing a pre-pulse laser beam 55 at a fuel droplet 29 from a direction which is perpendicular to a desired tilted orientation of the fuel target. In the example shown in FIG. 6, the pre-pulse laser beam 55 has an orientation generally along the line x=z (i.e. perpendicular to the y-direction and subtending 45° relative to both the x- and z-directions). The pre-pulse laser beam 55 is generated by a pre-pulse laser 56 and focused by optics 57. The pre-pulse laser beam 55 will cause the fuel droplet 29 to expand in directions which are perpendicular to the direction of incidence of the pre-pulse laser beam. This gives rise to a fuel target 29a which has expanded to form the shape shown in FIG. 5.

Although the above refers to tilting of the fuel target 29a at an angle of 45° relative to the x and y directions, the tilting may be by any suitable angle. The angle should be sufficient that the shape of the fuel target as seen by the incident laser beams is elliptical, and may for example be in the range 30°-60°.

The tilted fuel target 29a may have the form of a generally disk-shaped tilted target. Alternatively, the tilted fuel target may have any other suitable form (it is not essential that the tilted target be generally disk-shaped).

Figure 7A:
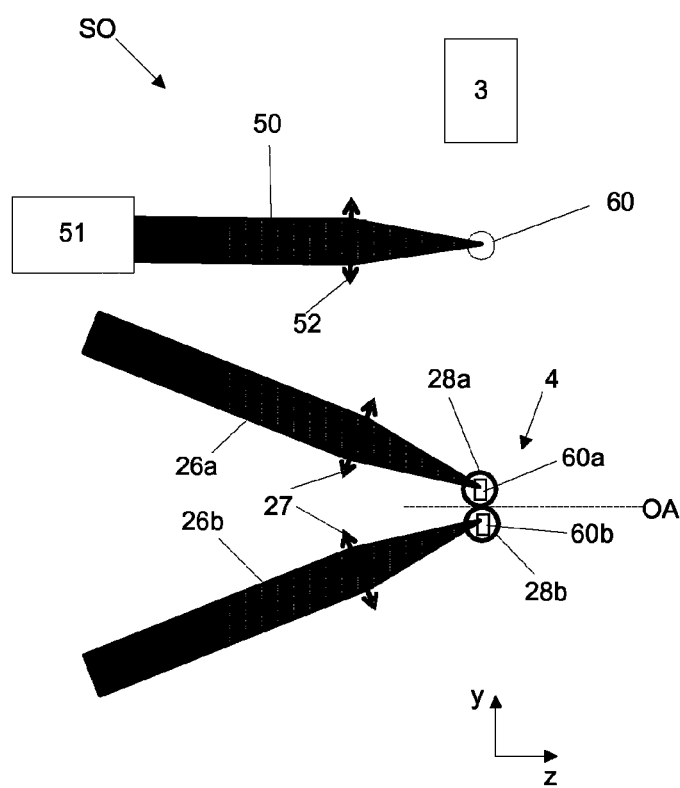
FIG. 7a and FIG. 7b schematically illustrate a radiation source according to an alternative embodiment of the invention.

FIG. 7 shows schematically an alternative embodiment of the invention. In the alternative embodiment a single fuel target is illuminated sequentially by the laser beams 26a,b. The fuel target 60 is converted from a droplet shape to a disk shape by a pre-pulse laser beam 50 generated by a laser 51 and focused by optics 52. Following the pre-pulse the fuel target is generally disk-shaped (e.g. pancake) and is not significantly rotated.

Figure 7B:
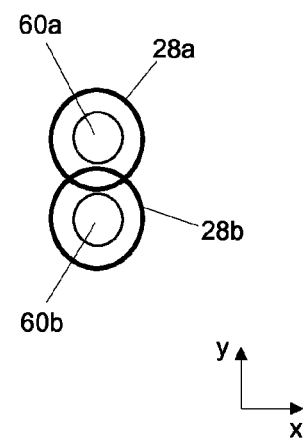

The fuel target is represented twice in FIG. 7 in the plasma formation region 4, and is labelled 60a and 60b. As can be seen from FIG. 7b, the fuel target 60a as seen by the first laser beam 26a is generally circular in shape. The focused first laser beam 28a converts part of the fuel target 60a into an EUV emitting plasma, and the remainder of the fuel target 60b travels onwards in the −y-direction. The second laser beam 26b is then incident upon the remainder of the fuel target 60b. The focused second laser beam 28b causes the remainder of the fuel target 60b to be converted into EUV radiation emitting plasma. The focused beam waists of the laser beams 28a,b are sufficiently close together that the EUV radiation as seen from the illumination system IL (see FIG. 1) has a generally elliptical form. The EUV radiation generated using a first laser beam 26a overlaps with the EUV radiation generated using the second laser beam 26b.

The elapsed time period between generation of EUV emitting plasma using the first laser beam 26a and generation of EUV emitting plasma using the second laser beam 26b may be selected by adjusting the speed of travel of the fuel droplets emitted by the fuel emitter 3.

In an alternative embodiment instead of the two laser beams 26a,b sequentially illuminating the same fuel target 60a,b the laser beams may be used to illuminate different fuel targets. Where this is the case the illumination of the fuel targets may be simultaneous or may be sequential.

In a further alternative embodiment two radiation sources SO may be used to generate EUV emitting plasma. Referring to FIG. 1, a second radiation source SO (not shown) which corresponds in construction with the illustrated radiation source may be provided. This will generate a second EUV beam having a second intermediate focus which is spatially separated from the intermediate focus 6 of the EUV beam generated by the first radiation source. The two EUV radiation beams may be manipulated by the illumination system IL such that they propagate substantially parallel to each other but are not co-linear. This provides a combined EUV radiation beam which is generally elliptical in shape.

Although embodiments of the invention have referred to the use of two laser beams when generating the EUV emitting plasma, more than two laser beams may be used. For example, three laser beams may be arranged to provide laser beam waists which are separated in the y-direction and which are arranged to each illuminate different portions of a fuel target (the laser beam waists may partially overlap in the manner shown in FIG. 4b).

Three or more radiation sources may be used to generate three or more EUV radiation beams which pass via spatially-separated intermediate focus and are then combined to form substantially parallel but not co-linear beams which collectively provide a combined EUV radiation beam having a generally elliptical shape.

In an embodiment, the direction of tilt of the fuel target about the y-axis may be alternated. This is advantageous because the EUV emitting plasma will emit EUV radiation in a non-homogeneous manner, and if the direction of tilt were not alternated then this would cause one portion of the collector 5 to cumulatively receive significantly more EUV radiation than an equivalent portion of the collector on an opposite side of the optical axis. Alternating the direction of tilt provides substantially equal cumulative amounts of EUV radiation on either side of the optical axis. The direction of tilt may be alternated after each fuel target or may be alternated after a series of fuel targets (e.g. five fuel targets, ten fuel targets or some other number of fuel targets).

Although the laser beams 26a, 26b have been shown and described as providing circular beam waists, the laser beams may be arranged to provide beam waists having other shapes (e.g. elliptical shapes). In an embodiment a single laser beam having an elliptical shape may be used.

In an embodiment, instead of providing two circular laser beam waists which partially overlap with each other, the laser beam waists may be elliptical. The elliptical laser beam waists may for example fully overlap with each other at the plasma formation region. The size and shape of the elliptical laser beam waists may substantially correspond with the shape of the fuel target.

Embodiments of the invention have been described as providing a generally elliptical EUV emitting plasma. However, embodiments of the invention may more generally provide an EUV emitting plasma which has an elongate form. A generally elliptical EUV emitting plasma may be considered to be an example of an EUV emitting plasma which has an elongate form. The term "elongate form" may be considered to mean significantly longer in one direction (e.g. the y-direction) than in a transverse direction (e.g. the x-direction).

In an embodiment, throughput of a lithographic apparatus (e.g. an EUV lithographic apparatus) may be increased by increasing the area on a substrate (e.g. a wafer) which is exposed during a single scanning exposure. This may be achieved by using a projection system with a reduced demagnification (i.e. a demagnification of less than 4×). When a projection system with reduced magnification is used then, for a given size of mask, the area on the substrate which is exposed during a single scanning exposure is increased.

Figure 8:
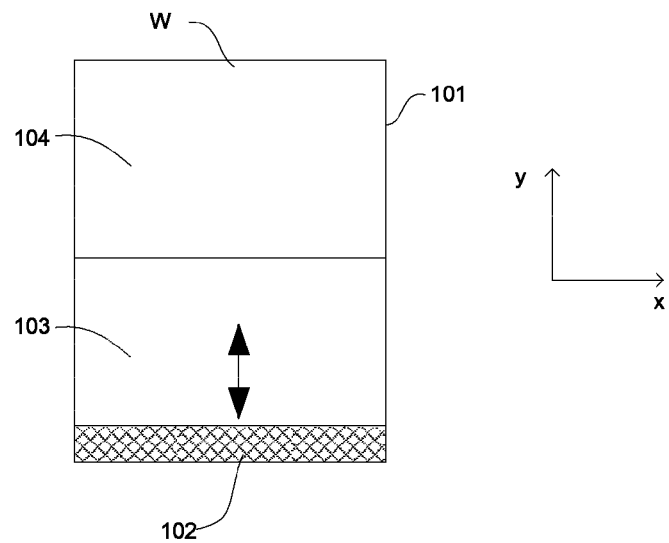
FIG. 8 schematically depicts an exposure area which may be exposed using an embodiment of the invention.

In an embodiment, the demagnification of the projection system may be reduced to around 2.53×. This allows an area which corresponds with two conventional full-fields to be exposed during a single scanning exposure. Referring to FIG. 8, an exposure area 101 measures 33 mm in the x-direction and 52 mm in the y-direction. A conventional full field measures 26 mm in the x-direction and 33 mm in the y-direction. Thus, the exposure area 101 shown in FIG. 8 corresponds with two conventional full fields which have been rotated by 90 degrees. A band of radiation 102, which may be referred to as an exposure slit, is shown together with a double headed arrow which indicates relative movement between the exposure slit and the wafer W during a scanning exposure.

In the embodiment shown in FIG. 8, two dies 103, 104 may be exposed using a single scanning exposure, each die having an area which corresponds with a conventional full-field. This allows a substantial increase of the throughput of the lithographic apparatus to be achieved.

Figure 9:
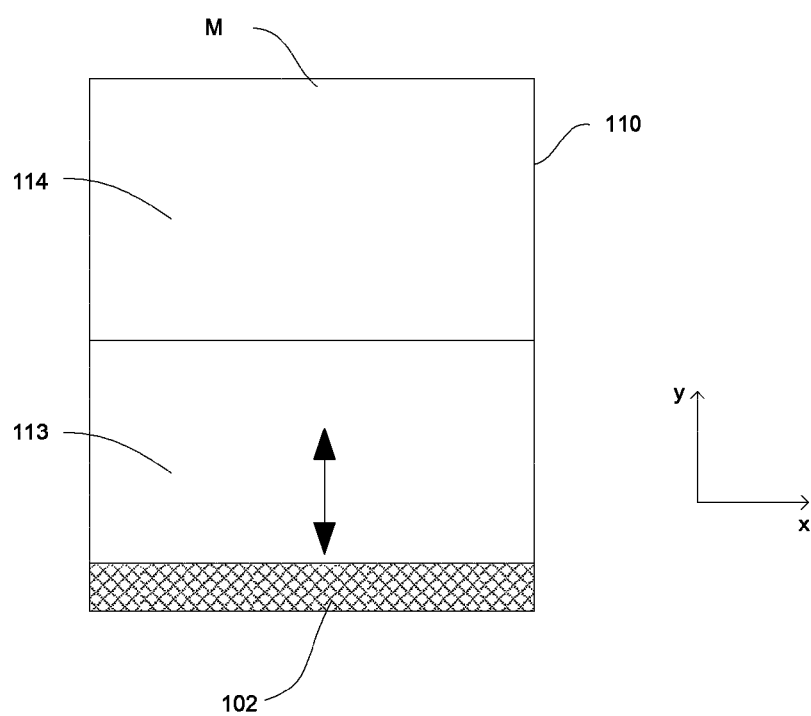
FIG. 9 schematically depicts a mask which may be used to expose the exposure area shown in FIG. 8.

FIG. 9 shows schematically a mask M which may be used by a lithographic apparatus to expose the area depicted in FIG. 8. The mask may be conventionally sized (e.g. a 6 inch mask). The patterned area 110 of the mask may have conventional dimensions, e.g. 104 mm in the x-direction and 132 mm in the y-direction. Providing a patterned area with these dimensions may be preferred because existing production systems are configured to produce and handle masks with this size of patterned area. The patterned area of the mask comprises two dies 113, 114.

The projection system of the lithographic apparatus may apply a reduction factor of around 3.15× in the x-direction and a reduction factor of around 2.53× in the y-direction, such that the patterned area of the mask forms an exposure area which measures 33 mm in the x-direction and 52 mm in the y-direction. Thus, the projection system applies different reduction factors in the x and y directions (the projection system is anamorphic).

In a further embodiment, the patterned area of a mask may have a dimension of around 124 mm in the x-direction and around 124 mm in the y-direction. The projection system of the lithographic apparatus may apply a reduction factor of around 4.77× in the x-direction and a reduction factor of around 7.52× in the y-direction, such that the patterned area of the mask forms an exposure area on the wafer which measures 26 mm in the x-direction and 16.5 mm in the y-direction.

Using anamorphic projection allows a mask pattern measuring around 104 mm in the x-direction to be used. Anamorphic projection is advantageous because it provides a reduction of around 20% of a mask error factor. That is, an error in the mask will have an x-dimension which is 20% less on the wafer than would be the case if anamorphic projection had not been used. If a reduction factor of 2.53 in the x-direction had been used instead (i.e. anamorphic projection had not been used) then this 20% reduction of mask error factor would not be achieved.

In other embodiments, a lithographic apparatus may be provided with an anamorphic projection system configured to allow other multiples of a conventional full field (26 mm by 33 mm) to be exposed using a single scanning exposure. For example, an exposure area measuring 33 mm in the x-direction and 78 mm in the y-direction may be exposed using an anamorphic projection system having a reduction factor of around 3.15× in the x-direction and around 1.83× in the y-direction. For example an exposure area measuring 66 mm in the x-direction and 78 mm in the y-direction may be exposed using an anamorphic projection system having a reduction factor of around 1.58× in the x-direction and a reduction factor of around 1.83× in the y-direction.

In general, anamorphic projection may be used to project an exposure area which has a dimension in the x-direction that corresponds with the conventionally exposed y-direction dimension (e.g. 33 mm), or a multiple thereof (e.g. 66 mm). The anamorphic projection may be such that the patterned area of the mask used for the projection has dimensions which correspond with those of a conventional mask (e.g. around 104 mm×132 mm).

Projection system reduction factors have been referred to with five significant figures, i.e. 2.53×, 3.15×, 1.83×, 1.58×, 4.77× and 7.52×. However, some adjustment of a projection system's demagnification may be possible during use (e.g. to accommodate tolerances in the lithographic apparatus) and it is therefore appropriate to refer the reduction factor of a projection system with two significant figures. Thus, in relation to the embodiments described above reduction factors are around 2.5×, around 3.2×, around 1.8×, around 1.6×, around 4.8× and around 7.5×.

FIGS. 10 and 11 illustrate schematically a problem which may arise when using an anamorphic projection system. In FIGS. 10 and 11 the anamorphic projection system has a reduction in the y-direction which is greater than the reduction in the x-direction. The y-direction reduction may be 8× and the x-direction reduction may be 4×. The Figures are very schematic, and thus do not have dimensions which correspond with specific reduction factors, but instead generally represent a greater reduction in the y-direction than in the x-direction.

Figures 10A, 10B:
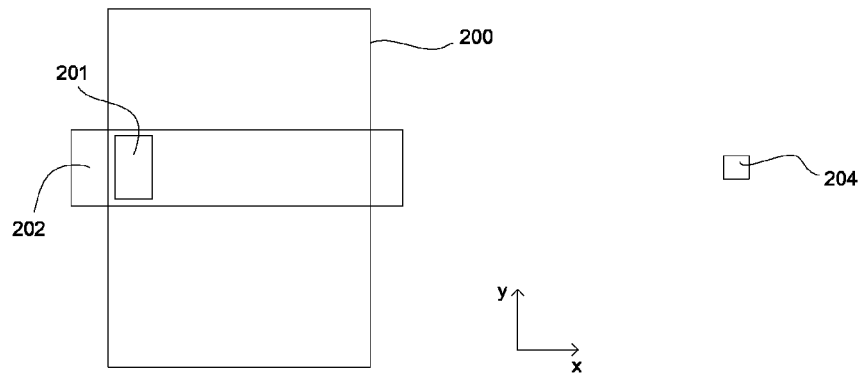
FIG. 10a, FIG. 10b, FIG. 11a and FIG. 11b schematically depict the effect of rotation of a projection system of the lithographic apparatus relative to a scanning direction of the lithographic apparatus.

Referring first to FIG. 10*a*, a mask 200 is shown with a pattern feature 201. The pattern feature is rectangular and has a longer dimension in the y-direction than in the x-direction. Also shown in FIG. 10*a* is a band of radiation 202 which is used to illuminate the mask 200 in order to expose the pattern onto a wafer. The band of radiation 202 may be referred to as an exposure slit. The orientation of the exposure slit 202 is determined by the illumination system IL of the lithographic apparatus (see FIG. 1). The projection system PS has an orientation which corresponds with the orientation of the illumination system IL. In FIG. 10*a* the mask 200 and the exposure slit 202 are both aligned with respect to the x and y directions. In other words, the mask 200 is aligned in the x and y directions with respect to the illumination system and the projection system of the lithographic apparatus.

FIG. 10*b* shows schematically a pattern feature 204 which has been exposed on a wafer by the lithographic apparatus. The anamorphic nature of the projection system is such that the pattern feature 201 on the mask 200 has been reduced by a greater extent in the y-direction than in the x-direction. As a result, the rectangular shape of the pattern feature 201 on the mask 200 has been converted to a square pattern feature 204 on the wafer.

Figures 11A, 11B:
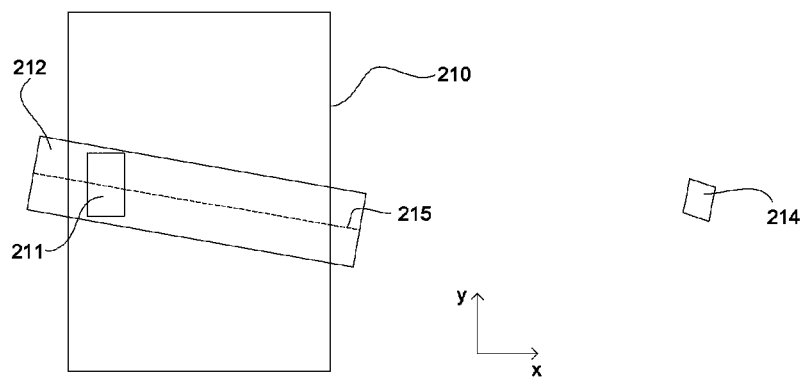

A problem arises if the orientation of the illumination system IL and the projection system PS does not correspond with the x- and y-directions. In this context, the y-direction may be defined as being the direction of scanning movement of the mask 200 during exposure of a wafer. In a conventional lithographic apparatus in which the reduction factor is the same in the x and y directions, rotation of the illumination system and projection system relative to the y-direction has no effect upon the pattern exposed on a wafer (assuming that the mask and the wafer are aligned to move in the same direction). However, when an anamorphic projection system is used this rotation will lead to a distortion of the resulting projected pattern. Referring to FIG. 11a, the exposure slit 212 is rotated such that it is no longer aligned to the x and y axes. The illumination system and projection system are also rotated in the same manner. As a result of this rotation, the reduction factors applied by the projection system introduce a distortion into the projected pattern. FIG. 11b shows schematically the pattern feature 214 imaged on a wafer when the exposure slit 212 (and projection system) has the orientation shown in FIG. 11a relative to the pattern feature 211. The portion of the pattern feature 211 at a centreline 215 of the exposure slit will be imaged correctly by the projection system. However, distortion of the pattern feature 211 will occur away from centreline 215, the size of the distortion increasing as a function of the distance from the centreline. Thus, when the mask 210 is positioned relative to the exposure slit 212 as shown in FIG. 11a, a pattern feature image 214 which is generally diamond-shaped will be formed. The diamond-shaped pattern feature image 214, shown in FIG. 11b, is schematic and is merely intended to generally illustrate the distortion of the pattern feature which will occur.

The reduction factor of the projection system can be described using the following matrix:

$$M_M = \begin{bmatrix} M_X & 0 \\ 0 & M_Y \end{bmatrix}$$

The rotation matrix can be described using the following matrix:

$$MR_{RS} = \begin{bmatrix} 1 & -\alpha \\ \alpha & 1 \end{bmatrix}$$

The reduction and rotation applied by the projection system is a multiplication of these matrices, i.e.:

$$MR_{WT} = M_M \times MR_{RS} = \begin{bmatrix} 1 & -\alpha \\ \alpha & 1 \end{bmatrix} \begin{bmatrix} M_X & 0 \\ 0 & M_Y \end{bmatrix}$$

The result of this multiplication is:

$$\begin{bmatrix} M_X & -M_X\alpha \\ +M_X\alpha & M_Y \end{bmatrix} = MR_{sym} + MR_{asym}.$$

Thus, in the case of the rectangle 201 at the mask, the effect of the rotation is to deform the rectangle such that it is imaged with a substantially diamond shape (as indicated schematically by diamond shape 214 in FIG. 11b). The extent to which the pattern feature image 214 is stretched into a diamond shape is a direct measurement of the rotation of the projection system and is linear as a function of that rotation.

Since the mask 210 moves relative to the exposure slit 212 during a scanning exposure, each portion of the pattern feature 211 on the mask will pass through the centreline 215 of the exposure slit 212. As a result, the distortion which is applied to the pattern feature 211 varies from a maximum at one edge of the exposure slit, passes through zero at the centre of the exposure slit and increases to a maximum (with opposite sign) at the other edge of the exposure slit. The result of this varying distortion will be fading of the pattern feature which is imaged on the substrate by the scanning exposure.

Figure 12A:
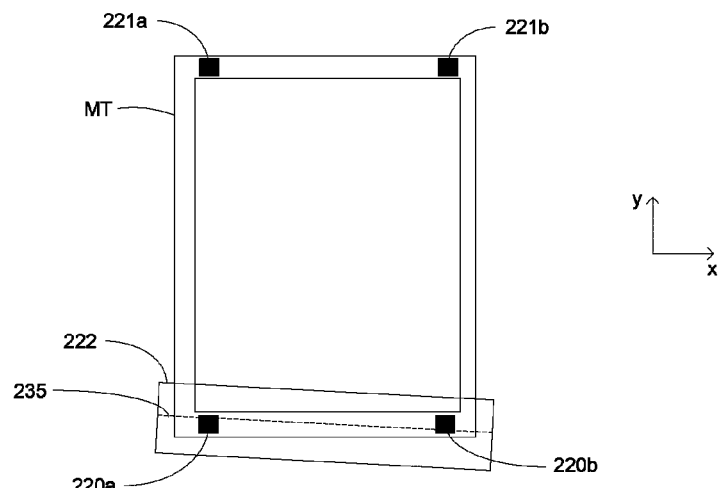
FIG. 12a, FIG. 12b and FIG. 12c schematically depict a method which may be used to measure the rotation of the projection system of the lithographic apparatus.

In order to avoid the problem described above, the orientation of the illumination system IL and projection system PS relative to the y-direction may be measured in order to allow the orientation to be corrected. FIG. 12 shows schematically a measurement method which may be used. A mask support structure MT is provided with two pairs of patterns 220a,b; 221a,b (e.g. alignment gratings or other structures). The patterns are provided on reflective areas located on the mask support structure. An exposure slit 222 of the lithographic apparatus is positioned such that it has a centerline 235 which passes through the centre of the patterns 220a,b, as is shown in FIG. 12a. Thus, a central portion of the exposure slit 222 is used to illuminate the patterns 220a,b. The projection system PS of the lithographic apparatus forms images of the illuminated patterns 220a,b at the substrate table WT (the substrate table is illustrated in FIG. 1). The positions of these aerial images are measured using detectors (not shown) in the substrate table WT.

Figure 12B:
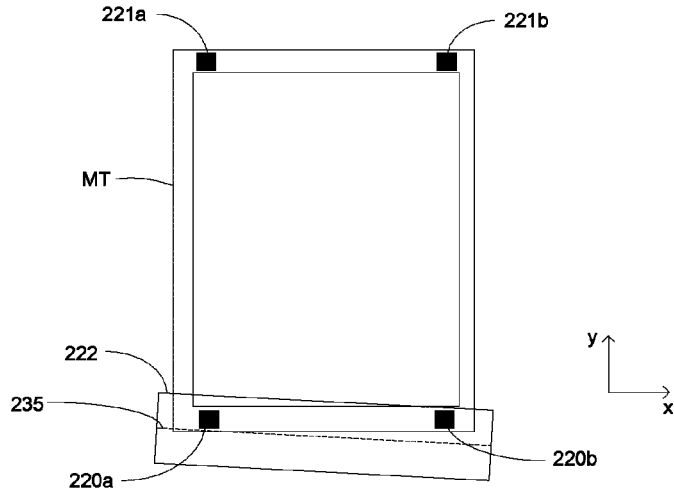

The mask support structure MT is then moved in the y-direction such that the patterns 220a,b are located away from the centerline 235 (e.g. at or adjacent to one edge of the exposure slit 222), as is shown in FIG. 12b. The resulting aerial images are again measured by the detectors in the substrate table WT. For the reasons explained above in connection with FIG. 11b the aerial images of the patterns 220a,b will be shifted in the x-direction due to the rotation of the exposure slit (and projection optics) relative to the y-direction. The size of the x-direction shift is proportional to the rotation of the exposure slit and projection optics away from the y-direction. Thus, the measured x-direction shift of the aerial images of the patterns may be used to determine the rotation of the exposure slit and projection optics.

Figure 12C:
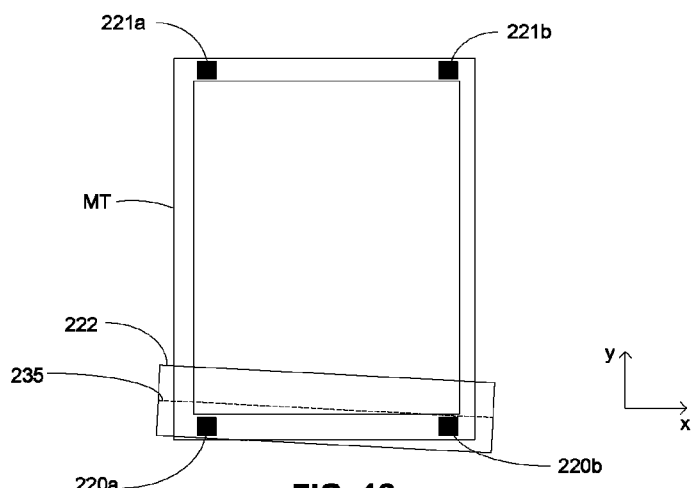

Referring to FIG. 12c, the mask support structure MT is moved such that the pattern 220a,b are on an opposite side of the centerline 235 (e.g. at or adjacent to an opposite edge of the exposure slit 222) and the measurement is again performed. This provides an additional measurement of an x-direction shift of the pattern aerial images. The measured x-direction shift will have an opposite direction to the shift that is measured by the preceding measurement step. Again, the size of the x-direction shift is proportional to the rotation of the exposure slit and the projection optics, and the measured shift may be used to determine the rotation of the exposure slit and projection optics. This additional measurement may for example be used to compensate for non-telecentricity of the projection system (non-telecentricity will cause the size of the x-direction shift to be different on either side of the centreline 235).

Additional measurements may be performed in the same manner for patterns 221a,b provided at an opposite end of the mask support structure MT.

Embodiments of the invention allow rotation of the illumination system and the projection system relative to the y-direction to be measured and then corrected. Correction may be achieved by modifying the direction of scanning movement of the mask and wafer, such that the y-direction of scanning movement is aligned relative to the illumination system and the projection system.

The rectangular exposure slit 222 shown in FIGS. 10-12 is merely an example of a band of radiation which may be generated by the illumination system IL of the lithographic apparatus (see FIG. 1). The band of radiation may have some other shape. For example, the band of radiation may be curved.

In an embodiment, there is provided a lithographic system comprising: a lithographic apparatus with an anamorphic projection system; and a radiation source configured to generate an EUV radiation emitting plasma at a plasma formation location, the EUV radiation emitting plasma having an elongate form in a plane substantially perpendicular to an optical axis of the radiation source.

In an embodiment, the EUV radiation emitting plasma is generally elliptical in a plane perpendicular to the optical axis of the radiation source. In an embodiment, the EUV radiation emitting plasma is elongate in a direction which corresponds with a major axis of a pupil of the anamorphic projection system. In an embodiment, the radiation source includes a pre-pulse laser which is configured to provide a laser pulse which causes a fuel droplet to expand by more in a first direction than in a second direction, the first and second directions being perpendicular to the direction of incidence of the laser pulse. In an embodiment, the laser pulse provided by the pre-pulse laser has a generally elliptical cross-section. In an embodiment, the laser pulse provided by the pre-pulse laser is linearly polarized in the first direction. In an embodiment, the radiation source includes a pre-pulse laser which is configured to cause a fuel droplet to expand to form a target which is tilted relative to an optical axis of the radiation source. In an embodiment, the tilt of the target relative to the optical axis of the radiation source is between 30 degrees and 60 degrees. In an embodiment, the target is generally disk-shaped. In an embodiment, the radiation source comprises two or more lasers configured to provide laser beam waists which partially overlap at the plasma formation location. In an embodiment, the two or more lasers are configured to provide laser beam pulses sequentially, such that a first portion of the EUV radiation emitting plasma is generated before a second portion of the EUV radiation emitting plasma is generated. In an embodiment, the first and second portions of the EUV radiation emitting plasma are generated from the same fuel target.

In an embodiment, there is provided a radiation source comprising a radiation source configured to generate an EUV radiation emitting plasma at a plasma formation location, the EUV radiation emitting plasma having an elongate form in a plane substantially perpendicular to an optical axis of the radiation source.

In an embodiment, the EUV radiation emitting plasma is generally elliptical in a plane perpendicular to the optical axis of the radiation source. In an embodiment, the radiation source includes a pre-pulse laser which is configured to provide a laser pulse which causes a fuel droplet to expand by more in a first direction than in a second direction, the first and second directions being perpendicular to the direction of incidence of the laser pulse. In an embodiment, the radiation source includes a pre-pulse laser which is configured to cause a fuel droplet to expand to form a target which is tilted relative to an optical axis of the radiation source.

In an embodiment, there is provided a lithographic system comprising: a lithographic apparatus with an anamorphic projection system; a first radiation source configured to generate an EUV radiation emitting plasma at a first plasma formation location and direct EUV radiation to a first intermediate focus; and a second radiation source configured to generate an EUV radiation emitting plasma at a second plasma formation location and direct EUV radiation to a second intermediate focus, the second intermediate focus being spatially displaced from the first intermediate focus; and an illumination system configured to receive EUV radiation from the first and second intermediate focuses.

In an embodiment, there is provided a lithographic method comprising: using a radiation source to generate an EUV radiation emitting plasma at a plasma formation location, the EUV radiation emitting plasma having an elongate form in a plane substantially perpendicular to an optical axis of the radiation source; using an illumination system to condition the resulting EUV radiation; patterning the EUV radiation in its cross-section to form a patterned radiation beam; and projecting the patterned EUV radiation beam onto a substrate using an anamorphic projection system.

In an embodiment, the EUV radiation emitting plasma is generally elliptical in a plane perpendicular to the optical axis of the radiation source. In an embodiment, the EUV radiation emitting plasma is elongate in a direction which corresponds with a major axis of a pupil of the anamorphic projection system.

In an embodiment, there is provided a method of measuring rotation of a projection system of a lithographic apparatus relative to a scanning direction of the lithographic apparatus, the method comprising: illuminating patterns using a central portion of a band of radiation and measuring positions of aerial images of the patterns formed by the projection system; illuminating the patterns using a portion of the band of radiation which is located away from the central portion and measuring positions of aerial images of the patterns formed by the projection system; illuminating the patterns using a portion of the band of radiation which is located away from the central portion in an opposite direction and measuring positions of aerial images of the patterns formed by the projection system; and calculating the rotation of the projection system by comparing the measured positions of the pattern aerial images.

In an embodiment, calculating the rotation of the projection system comprises comparing the measured positions of the pattern aerial images in a direction substantially perpendicular to the scanning direction of the lithographic apparatus. In an embodiment, the method further comprises using differences between the measured positions to determine non-telecentricity of the projection system. In an embodiment, the patterns are provided on a mask support structure of the lithographic apparatus.

In an embodiment, the patterns are provided at opposite ends of the mask support structure of the lithographic apparatus, and wherein the method is performed using patterns provided at one end of the mask support structure and is then performed using patterns provided at the opposite end of the mask support structure.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic system comprising:
   a lithographic apparatus with an anamorphic projection system; and
   a radiation source configured to generate an EUV radiation emitting plasma at a plasma formation location, the EUV radiation emitting plasma emitting EUV radiation in a shape having an elongate form in a plane substantially perpendicular to an optical axis of the radiation source.

2. The lithographic system of claim 1, wherein the EUV radiation emitting plasma is generally elliptical in a plane perpendicular to the optical axis of the radiation source.

3. The lithographic system of claim 1, wherein the EUV radiation emitting plasma is elongate in a direction which corresponds with a major axis of a pupil of the anamorphic projection system.

4. The lithographic system of claim 1, wherein the radiation source includes a pre-pulse laser which is configured to provide a laser pulse which causes a fuel droplet to expand by more in a first direction than in a second direction, the first and second directions being perpendicular to the direction of incidence of the laser pulse.

5. The lithographic system of claim 4, wherein the laser pulse provided by the pre-pulse laser has a generally elliptical cross-section.

6. The lithographic system of claim 4, wherein the laser pulse provided by the pre-pulse laser is linearly polarized in the first direction.

7. The lithographic system of claim 1, wherein the radiation source includes a pre-pulse laser which is configured to cause a fuel droplet to expand to form a target which is tilted relative to an optical axis of the radiation source.

8. The lithographic system of claim 7, wherein the tilt of the target relative to the optical axis of the radiation source is between 30 degrees and 60 degrees.

9. The lithographic system of claim 7, wherein the target is generally disk-shaped.

10. The lithographic system of claim 1, wherein the radiation source comprises two or more lasers configured to provide laser beam waists which partially overlap at the plasma formation location.

11. The lithographic system of claim 10, wherein the two or more lasers are configured to provide laser beam pulses sequentially, such that a first portion of the EUV radiation emitting plasma is generated before a second portion of the EUV radiation emitting plasma is generated.

12. The lithographic system of claim 11, wherein the first and second portions of the EUV radiation emitting plasma are generated from the same fuel target.

13. A radiation source comprising a plasma formation system configured to generate an EUV radiation emitting plasma at a plasma formation location, the EUV radiation emitting plasma emitting EUV radiation in a shape having an elongate form in a plane substantially perpendicular to an optical axis of the radiation source.

14. The radiation source of claim 13, wherein the EUV radiation emitting plasma is generally elliptical in a plane perpendicular to the optical axis of the radiation source.

15. The radiation source of claim 13, further comprising a pre-pulse laser which is configured to provide a laser pulse which causes a fuel droplet to expand by more in a first direction than in a second direction, the first and second directions being perpendicular to the direction of incidence of the laser pulse.

16. The radiation source of claim 13, further comprising a pre-pulse laser which is configured to cause a fuel droplet to expand to form a target which is tilted relative to an optical axis of the radiation source.

17. A lithographic method comprising:
   using a radiation source to generate an EUV radiation emitting plasma at a plasma formation location, the EUV radiation emitting plasma emitting EUV radiation in a shape having an elongate form in a plane substantially perpendicular to an optical axis of the radiation source;
   using an illumination system to condition the resulting EUV radiation;
   patterning the EUV radiation in its cross-section to form a patterned radiation beam; and
   projecting the patterned EUV radiation beam onto a substrate using an anamorphic projection system.

18. The lithographic method of claim 17, wherein the EUV radiation emitting plasma is generally elliptical in a plane perpendicular to the optical axis of the radiation source.

19. The lithographic method of claim 17, wherein the EUV radiation emitting plasma is elongate in a direction which corresponds with a major axis of a pupil of the anamorphic projection system.

20. A lithographic system comprising:
   a lithographic apparatus with an anamorphic projection system; and
   a radiation source configured to generate an EUV radiation emitting plasma at a plasma formation location, the EUV radiation emitting plasma having an elongate form in a plane substantially perpendicular to an optical axis of the radiation source and the EUV radiation emitting plasma is elongate in a direction which corresponds with a major axis of a pupil of the anamorphic projection system.

21. The lithographic system of claim 20, wherein the radiation source includes a pre-pulse laser configured to provide a laser pulse which causes a fuel droplet to expand by more in a first direction than in a second direction, the first and second directions being perpendicular to the direction of incidence of the laser pulse.

22. The lithographic system of claim 20, wherein the radiation source includes a pre-pulse laser configured to cause a fuel droplet to expand to form a target which is tilted relative to an optical axis of the radiation source.

23. The lithographic system of claim 20, wherein the radiation source comprises two or more lasers configured to provide laser beam waists which partially overlap at the plasma formation location.

24. A radiation source comprising:
   a droplet generator configured to generate a droplet of fuel; and
   a laser system configured apply a laser beam to the droplet to change the shape of the droplet and to apply a laser beam to the changed droplet to generate an EUV radiation emitting plasma from the changed droplet at a plasma formation location such that the EUV radiation emitting plasma emits EUV radiation in a shape having an elongate form in a plane substantially perpendicular to an optical axis of the radiation source.

25. The radiation source of claim 24, wherein the laser system includes a pre-pulse laser configured to provide a laser pulse which causes the droplet to expand by more in a first direction than in a second direction, the first and second directions being perpendicular to the direction of incidence of the laser pulse.

26. The radiation source of claim 24, wherein the laser system is configured to provide two or more laser beams having laser beam waists which partially overlap at the plasma formation location.

27. The radiation source of claim 24, wherein the laser system includes a pre-pulse laser configured to cause the droplet to expand to form a target which is tilted relative to an optical axis of the radiation source.

* * * * *